US008389923B2

(12) United States Patent
Naruse et al.

(10) Patent No.: US 8,389,923 B2
(45) Date of Patent: Mar. 5, 2013

(54) PHOTOELECTRIC CONVERSION DEVICE, IMAGE SENSING SYSTEM, AND METHOD OF MANUFACTURING PHOTOELECTRIC CONVERSION DEVICE

(75) Inventors: Hiroaki Naruse, Yokohama (JP); Ryuichi Mishima, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 262 days.

(21) Appl. No.: 12/853,547

(22) Filed: Aug. 10, 2010

(65) Prior Publication Data

US 2011/0049332 A1 Mar. 3, 2011

(30) Foreign Application Priority Data

Aug. 28, 2009 (JP) ................................. 2009-199017

(51) Int. Cl.
*H01L 27/00* (2006.01)
*H01L 31/00* (2006.01)
*H01L 31/0232* (2006.01)

(52) U.S. Cl. .................... 250/208.1; 250/214.1; 257/432

(58) Field of Classification Search ............... 250/208.1, 250/214.1, 216; 257/292, 259, 461, 432
See application file for complete search history.

(56) References Cited

U.S. PATENT DOCUMENTS

| 5,900,622 | A * | 5/1999 | Ogura et al. ............... 250/208.1 |
| 6,492,226 | B1 * | 12/2002 | Hsue et al. .................... 438/253 |
| 7,205,523 | B2 | 4/2007 | Mishima et al. ........... 250/208.1 |
| 7,365,380 | B2 | 4/2008 | Yuzurihara et al. ........... 257/292 |
| 7,531,779 | B2 * | 5/2009 | Ahn et al. ................... 250/208.1 |
| 7,749,788 | B2 | 7/2010 | Okagawa et al. ............... 438/48 |
| 2007/0205439 | A1 | 9/2007 | Okita et al. .................... 257/228 |
| 2008/0029793 | A1 | 2/2008 | Watanabe et al. ............. 257/291 |
| 2008/0054388 | A1 | 3/2008 | Nakata et al. ................. 257/432 |
| 2008/0203450 | A1 | 8/2008 | Naruse et al. ................. 257/290 |
| 2008/0203509 | A1 | 8/2008 | Mishima et al. .............. 257/432 |
| 2009/0200622 | A1 * | 8/2009 | Tai et al. ........................ 257/432 |
| 2010/0173444 | A1 | 7/2010 | Mishima et al. ................ 438/60 |

FOREIGN PATENT DOCUMENTS

| JP | 2000-150846 A | 5/2000 |
| JP | 2007-287818 A | 11/2007 |

* cited by examiner

*Primary Examiner* — Georgia Y Epps
*Assistant Examiner* — Don Williams
(74) *Attorney, Agent, or Firm* — Fitzpatrick, Cella, Harper & Scinto

(57) ABSTRACT

A photoelectric conversion device having a pixel array region in which a plurality of pixels each including a photoelectric converter are arrayed, and a peripheral region arranged around the pixel array region, the device comprising a multilayer wiring structure which is arranged on a semiconductor substrate, and includes wiring layers in the peripheral region more than wiring layers in the pixel array region, and a plurality of interlayer lenses which is arranged on the multilayer wiring structure in the pixel array region, wherein the plurality of interlayer lenses each includes a first insulator, and a second insulator arranged to cover the first insulator, and having a refractive index higher than the first insulator, and wherein the first insulator in each of the plurality of interlayer lenses, and an uppermost interlayer insulating film in the peripheral region in the multilayer wiring structure are made of an identical material.

11 Claims, 5 Drawing Sheets

PHOTOELECTRIC CONVERSION DEVICE, IMAGE SENSING SYSTEM, AND METHOD OF MANUFACTURING PHOTOELECTRIC CONVERSION DEVICE

BACKGROUND OF THE INVENTION

1. Field of the Invention

The present invention relates to a photoelectric conversion device, an image sensing system, and a method of manufacturing the photoelectric conversion device.

2. Description of the Related Art

MOS photoelectric conversion devices that use MOS transistors are under vigorous development as the latest in photoelectric conversion devices. In such photoelectric conversion devices, the pixel size decreases as the number of pixels increases. As the pixel size decreases, both the opening area of a wiring layer and the area of the light-receiving surface of a photoelectric converter (for example, a photodiode) in each pixel, in turn, is reduced, which could degrade the sensitivity of the photoelectric converter. Hence, an interlayer lens, which functions as a lens for suppressing degradation in sensitivity of the photoelectric converter, is often formed between the photoelectric converter and an on-chip lens. Also, because the thickness of a wiring layer is limited by the process rule, the aspect ratio of the opening of the wiring layer inevitably rises.

Japanese Patent Laid-Open No. 2000-150846 discloses an arrangement that improves the focusing efficiency of an on-chip lens by forming an interlayer film of a photoelectric converter to be thinner than an interlayer film including a passivation film of peripheral circuitry so that a light-receiving unit and the on-chip lens have a short distance between them. However, Japanese Patent Laid-Open No. 2000-150846 proposes no method of manufacturing an interlayer lens.

SUMMARY OF THE INVENTION

The present invention provides a technique for manufacturing a plurality of interlayer lenses and a multilayer wiring structure using few steps.

One of the aspects of the present invention provides a photoelectric conversion device having a pixel array region in which a plurality of pixels each including a photoelectric converter are arrayed, and a peripheral region arranged around the pixel array region, the device comprising a multilayer wiring structure which is arranged on a semiconductor substrate, and includes wiring layers in the peripheral region more than wiring layers in the pixel array region, and a plurality of interlayer lenses which is arranged on the multilayer wiring structure in the pixel array region, wherein the plurality of interlayer lenses each includes a first insulator, and a second insulator arranged to cover the first insulator, and having a refractive index higher than the first insulator, and wherein the first insulator in each of the plurality of interlayer lenses, and an uppermost interlayer insulating film in the peripheral region in the multilayer wiring structure are made of an identical material.

Further features of the present invention will become apparent from the following description of exemplary embodiments with reference to the attached drawings.

DESCRIPTION OF THE EMBODIMENTS

Figure 1A:
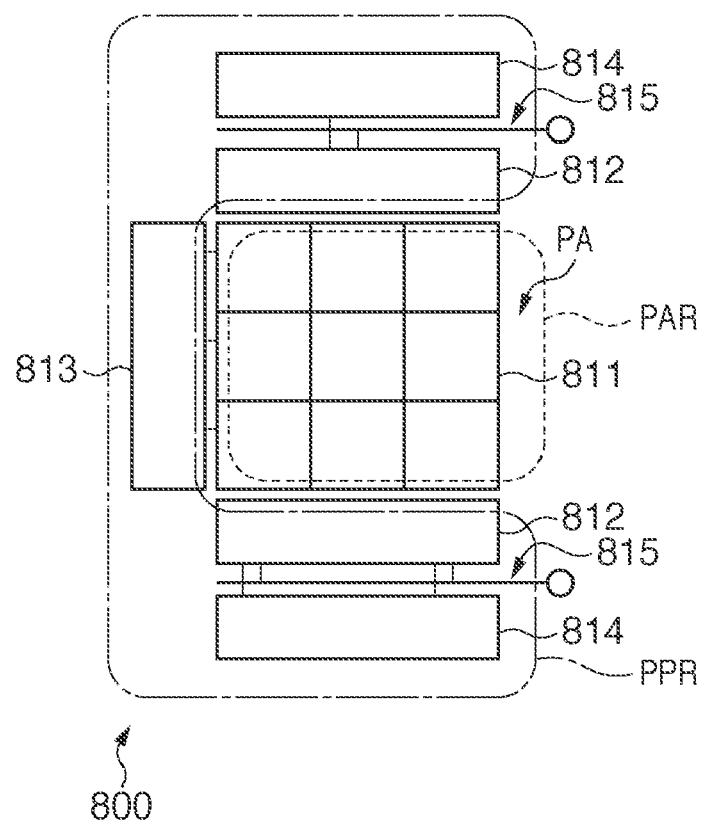
FIGS. 1A and 1B are a block diagram and a circuit diagram showing the arrangement of a photoelectric conversion device according to an embodiment.
Figure 1B:
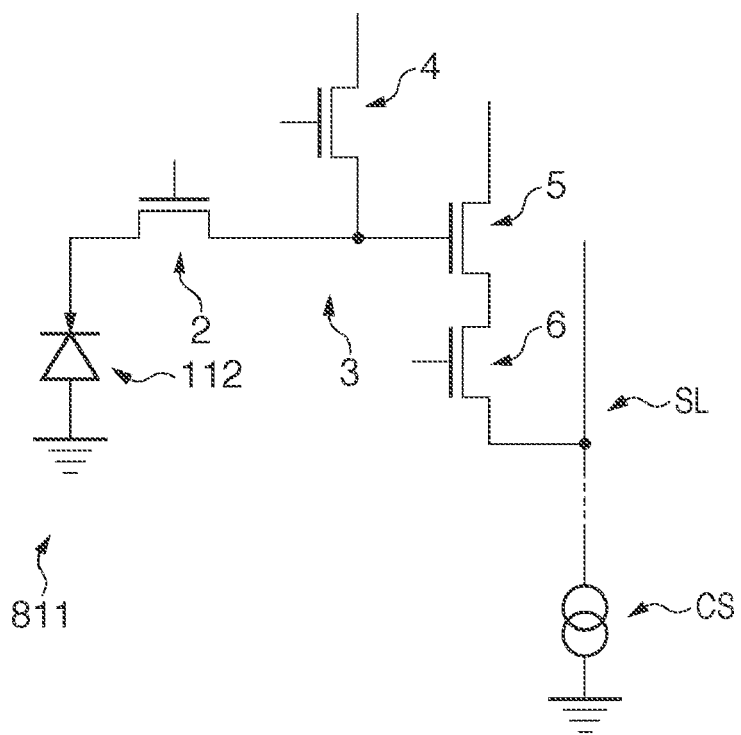

The schematic arrangement of a photoelectric conversion device 800 according to an embodiment of the present invention will be described with reference to FIGS. 1A and 1B. FIG. 1A is a block diagram showing the arrangement of the photoelectric conversion device 800. FIG. 1B is a circuit diagram showing the arrangement of a pixel 811. The photoelectric conversion device 800 has a pixel array region PAR and peripheral region PPR. A pixel array PA is arranged in the pixel array region PAR. A circuit for controlling the pixel array PA, and a circuit for processing signals output from the pixel array PA are arranged in the peripheral region PPR. A vertical scanning circuit 813, signal processing circuit 812, and horizontal scanning circuit 814, for example, are arranged in the peripheral region PPR.

A plurality of pixels 811 are arrayed two-dimensionally (in directions parallel to rows and columns) in the pixel array PA. FIG. 1A shows an exemplary case in which the pixel array PA includes 3 (rows)×3 (columns) pixels 811. A plurality of pixels 811 may be one-dimensionally arrayed in the pixel array PA. A pixel means herein the unit of a set of elements for reading out a signal generated by one photoelectric converter. Adjacent photoelectric converters can also share pixel elements, and the unit of a set of elements for reading out a signal from one photoelectric converter in this case will be referred to as a pixel hereinafter as well.

Each pixel 811 in the pixel array PA includes a photoelectric converter 112, transfer unit 2, charge-voltage converter 3, reset unit 4, output unit 5, and selection unit 6, as shown in FIG. 1B. The photoelectric converter 112 generates a charge corresponding to its incident light. The photoelectric converter 112 is, for example, a photodiode. The transfer unit 2 transfers the charge generated by the photoelectric converter 112 to the charge-voltage converter 3. The transfer unit 2 is, for example, a transfer transistor, and transfers the charge generated by the photoelectric converter 112 to the charge-voltage converter 3 upon being turned on as its gate receives a transfer control signal at active level from the vertical scanning circuit 813 (to be described later). The charge-voltage converter 3 converts the transferred charge into a voltage. The charge-voltage converter 3 is, for example, a floating diffusion. The reset unit 4 resets the charge-voltage converter 3. The reset unit 4 is, for example, a reset transistor, and resets the charge-voltage converter 3 upon being turned on as its gate receives a reset control signal at active level from the vertical scanning circuit 813. The output unit 5 outputs a signal corresponding to the voltage of the charge-voltage converter 3 to a signal line SL. The output unit 5 is, for example, an amplifying transistor, and performs a source follower operation in cooperation with a current source load CS connected to the signal line SL to output a signal corresponding to the voltage of the charge-voltage converter 3 to the signal line SL. That is, the output unit 5 outputs a noise signal corresponding to the voltage of the charge-voltage converter 3 to the signal line SL after the charge-voltage converter 3 is reset by the reset unit 4. The output unit 5 also outputs an optical signal corresponding to the voltage of the charge-voltage converter 3 to the signal line SL after the charge of the photoelectric converter 112 is transferred to the charge-voltage converter 3 by the transfer unit 2. The selection unit 6 sets the pixel 811 to a selected state/unselected state. The selection unit 6 is, for example, a selection transistor, and sets the pixel 811 to a selected state upon being turned on as its gate receives a selection control signal at active level from the vertical scanning circuit 813. The selection unit 6 sets the pixel 811 to an unselected state upon being turned off as its gate receives a selection control signal at non-active level from the vertical scanning circuit 813.

Each pixel 811 may include no selection unit 6. In an arrangement including no selection unit 6, the reset unit 4 sets the pixel 811 to a selected state/unselected state. In this case, the reset unit 4 resets the charge-voltage converter 3 to a first potential (at, for example, H level) upon being turned on as its drain is supplied with the first potential and its gate is supplied with a reset control signal at active level, thereby setting the pixel 811 to a selected state. The reset unit 4 resets the charge-voltage converter 3 to a second potential (at, for example, L level) upon being turned on as its drain is supplied with the second potential and its gate is supplied with a reset control signal at active level, thereby setting the pixel 811 to an unselected state. Note that the vertical scanning circuit 813 controls the potential to be reset by the reset unit 4.

The vertical scanning circuit 813 scans the pixel array PA in the vertical direction (a direction parallel to columns) to select rows (readout rows), from which signals are to be read out, in the pixel array PA so that signals are output from the selected readout rows to a plurality of signal lines SL. The vertical scanning circuit 813 includes, for example, a vertical shift register.

The signal processing circuit 812 processes the signals output from the readout rows via the plurality of signal lines SL. As an example, the signal processing circuit 812 performs a process of amplifying the noise signals and optical signals, output from the readout rows to the signal lines SL at different timings, for each column. As another example, the signal processing circuit 812 may perform a CDS process of obtaining the differences between the noise signals and optical signals, output from the readout rows to the signal lines SL at different timings, for each column to generate an image signal free from any noise signals. As still another example, the signal processing circuit 812 may perform a parallel-serial conversion process of sequentially outputting, to an output line 815, signals in each column selected by the vertical scanning circuit 813 among signals in a plurality of columns output from the readout rows. As still another example, the signal processing circuit 812 may perform a process of A/D-converting signals in each column output from the readout rows.

The horizontal scanning circuit 814 scans the signal processing circuit 812 in the horizontal direction (a direction parallel to rows) so that signals in each column held in the signal processing circuit 812 are sequentially output to the output line 815. The horizontal scanning circuit 814 includes, for example, a horizontal shift register.

The cross-sectional structure of the photoelectric conversion device 800 according to the embodiment will be described next with reference to FIG. 2. For the sake of descriptive simplicity, FIG. 2 shows side by side an arrangement corresponding to one pixel in the pixel array region PAR, and an arrangement corresponding to one transistor in the peripheral region PPR.

Figure 2:
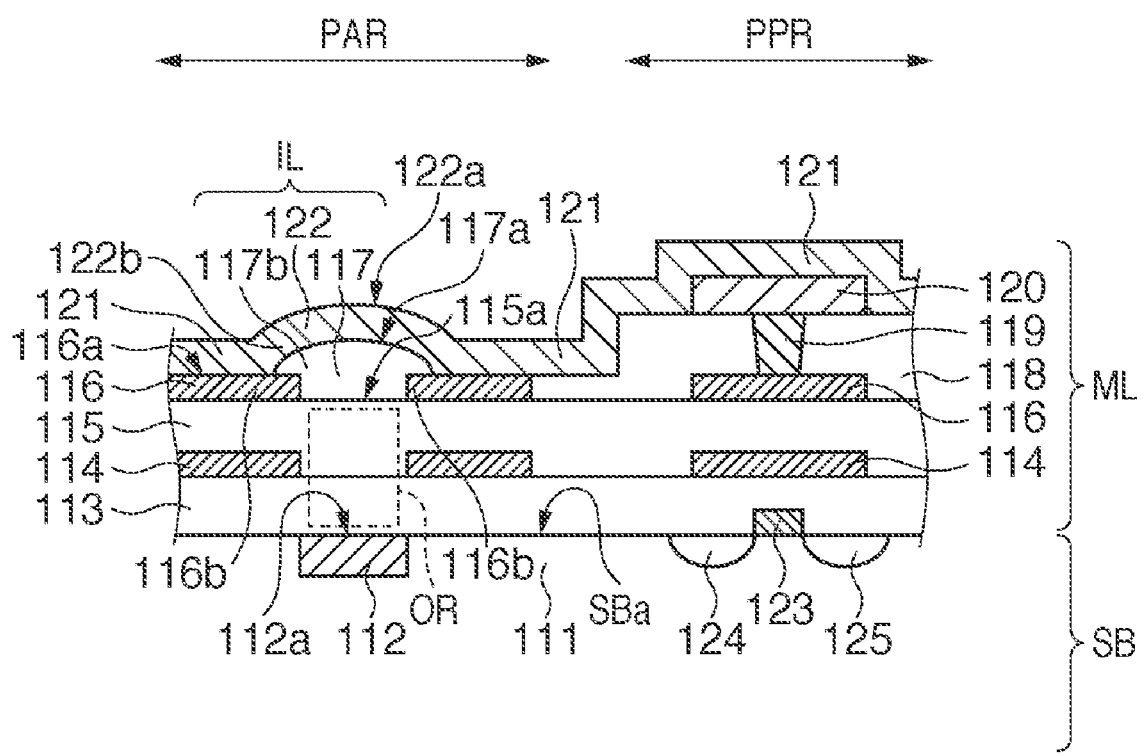
FIG. 2 is a sectional view showing the cross-sectional structure of the photoelectric conversion device according to the embodiment.

The photoelectric conversion device 800 includes a semiconductor substrate SB, a multilayer wiring structure ML, a plurality of interlayer lenses IL, and a passivation film 121, as shown in FIG. 2. Although a lower planarizing film, a color filter layer, an upper planarizing film, and a plurality of microlenses, for example, are also arranged on the plurality of interlayer lenses IL and passivation film 121 in practice, they are not shown in FIG. 2 and will not be described for the sake of simplicity.

In the pixel array region PAR, a plurality of photoelectric converters 112 are arranged on the semiconductor substrate SB. For example, a plurality of photoelectric converters 112 are arrayed two-dimensionally (in directions parallel to rows and columns) in correspondence with an array of the plurality of pixels 811 on the semiconductor substrate SB. The photoelectric converter 112 has a charge storage region containing a high-concentration impurity of a first conductivity type (for example, the n-type), in which the readout charges (for example, electrons) act as majority carriers. In the peripheral region PPR, semiconductor regions 124 and 125 each of which serves as the source or drain of a transistor are arranged on the semiconductor substrate SB at positions adjacent to a gate 123 arranged on the semiconductor substrate SB. The semiconductor regions 124 and 125 contain a high-concentration impurity of the first conductivity type (for example, the n-type), in which the readout charges (for example, electrons) act as majority carriers. A well region 111 containing a low-concentration impurity of a second conductivity type (for example, the p-type) opposite to the first conductivity type surrounds the photoelectric converter 112 and semiconductor regions 124 and 125 on the semiconductor substrate SB.

The multilayer wiring structure ML is arranged on the semiconductor substrate SB. In the multilayer wiring structure ML, the pixel array region PAR includes wiring layers more than those in the peripheral region PPR. In the multilayer wiring structure ML, for example, the pixel array region PAR has two wiring layers, and the peripheral region PPR has three wiring layers, as shown in FIG. 2. The multilayer wiring structure ML includes the gate 123, an interlayer insulating film 113, a wiring layer 114, an interlayer insulating film 115, a wiring layer 116, an interlayer insulating film 118, a wiring layer 120, and a via plug 119. Although contact plugs or via plugs are also present in, for example, the interlayer insulating films 113 and 115 in practice, they are not shown.

The gate 123 is arranged on the semiconductor substrate SB in the peripheral region PPR. The gate 123 forms a MOS transistor, together with the semiconductor regions 124 and 125. The gate 123 can also be a lowermost wiring layer in the multilayer wiring structure ML. The gate 123 is made of, for example, polysilicon. The interlayer insulating film 113 is arranged in the pixel array region PAR and peripheral region PPR so as to insulate the semiconductor substrate SB, gate 123, and wiring layer 114 from each other. The interlayer insulating film 113 covers the semiconductor substrate SB and gate 123. The interlayer insulating film 113 is made of, for example, silicon oxide. The wiring layer 114 is arranged on the interlayer insulating film 113 in the pixel array region PAR and peripheral region PPR. The wiring layer 114 in the pixel array region PAR defines an opening region OR above the photoelectric converter 112. The wiring layer 114 is made of, for example, a metal or intermetallic compound containing aluminum as a major component.

The interlayer insulating film 115 is arranged in the pixel array region PAR and peripheral region PPR so as to insulate the wiring layer 114 and wiring layer 116 from each other. The interlayer insulating film 115 covers the wiring layer 114 and interlayer insulating film 113 in the pixel array region PAR and peripheral region PPR. The interlayer insulating film 115 is an uppermost interlayer insulating film in the pixel array region PAR in the multilayer wiring structure ML. The interlayer insulating film 115 is made of, for example, silicon oxide. The wiring layer 116 is an uppermost wiring layer in the pixel array region PAR. The wiring layer 116 is arranged on the interlayer insulating film 115 in the pixel array region PAR and peripheral region PPR. The wiring layer 116 in the pixel array region PAR defines the opening region OR above the photoelectric converter 112. The wiring layer 116 is made of, for example, a metal or intermetallic compound containing aluminum as a major component. Note that the opening region OR is defined by one or both of the wiring layers 114 and 116.

The interlayer insulating film 118 is arranged in the peripheral region PPR so as to insulate the wiring layer 116 and wiring layer 120 from each other. The interlayer insulating film 118 is not arranged in the pixel array region PAR. That is, the interlayer insulating film 118 covers the wiring layer 116 and interlayer insulating film 115 in the peripheral region PPR, but does not cover the wiring layer 116 and interlayer insulating film 115 in the pixel array region PAR. The interlayer insulating film 118 is an uppermost interlayer insulating film in the peripheral region PPR in the multilayer wiring structure ML. The interlayer insulating film 118 is made of, for example, silicon oxide. The wiring layer 120 is an uppermost wiring layer in the peripheral region PPR. The wiring layer 120 is arranged on the interlayer insulating film 118 in the peripheral region PPR. The wiring layer 120 is made of, for example, a metal or intermetallic compound containing aluminum as a major component. The via plug 119 connects the wiring layer 116 and wiring layer 120 to each other. The via plug 119 is made of, for example, a metal or intermetallic compound containing tungsten as a major component.

The plurality of interlayer lenses IL are arranged on the multilayer wiring structure ML in the pixel array region PAR. The plurality of interlayer lenses IL guide light beams to the photoelectric converter 112. Each interlayer lens IL includes a first insulator 117 and second insulator 122.

The first insulator 117 covers a surface 115a of a portion, positioned above the photoelectric converter 112, in the interlayer insulating film 115. The first insulator 117 covers the opening region OR when seen through from a direction perpendicular to a surface SBa of the semiconductor substrate SB. For example, the first insulator 117 covers both the surface 115a of the interlayer insulating film 115, and an edge 116b of the wiring layer 116 near the opening region OR. The first insulator 117 has a shape convexed in a direction away from the surface SBa of the semiconductor substrate SB. For example, the first insulator 117 has a roughly semispherical shape and has, as an upper surface 117a, a curved surface projecting in a direction away from the surface SBa of the semiconductor substrate SB. The upper surface 117a of the first insulator 117 is higher than a surface 116a of the uppermost wiring layer 116 in the pixel array region PAR with respect to the surface SBa of the semiconductor substrate SB. The first insulator 117 is made of the same material as the interlayer insulating film 118. The first insulator 117 is made of, for example, silicon oxide.

The second insulator 122 covers the first insulator 117. The second insulator 122 has a shape convexed in a direction away from the surface SBa of the semiconductor substrate SB as the first insulator 117 has a shape convexed in a direction away from the surface SBa of the semiconductor substrate SB. For example, the second insulator 122 has, as an upper surface 122a, a curved surface projecting in a direction away from the surface SBa of the semiconductor substrate SB as the first insulator 117 has, as the upper surface 117a, a curved surface projecting in a direction away from the surface SBa of the semiconductor substrate SB. The second insulator 122 is made of the same material as the passivation film 121, which has a refractive index higher than the first insulator 117. In other words, the second insulator 122 is made of a material with a dielectric constant higher than the first insulator 117. The second insulator 122 is made of, for example, silicon nitride.

Note that in each interlayer lens IL, the second insulator 122 with a refractive index higher than the first insulator 117 covers the convex, first insulator 117. Note also that the interface between the first insulator 117 and the second insulator 122 forms a curved surface projecting in a direction away from the surface SBa of the semiconductor substrate SB. Thus, light which enters an edge 122b of the second insulator 122 at a large incident angle with respect to a normal to the surface SBa of the semiconductor substrate SB is refracted toward the photoelectric converter 112 by the interface, and passes through an edge 117b of the first insulator 117. That is, light which passes through the vicinity of the edge 122b of the second insulator 122 is bent toward the photoelectric converter 112 as if it were sucked into it. Thus, the second insulator 122 and first insulator 117 function as the interlayer lens IL.

The passivation film 121 covers the uppermost wiring layer 116 in the pixel array region PAR, and the uppermost wiring layer 120 in the peripheral region PPR. Thus, the passivation film 121 protects the multilayer wiring structure ML and semiconductor substrate SB. The passivation film 121 is made of, for example, silicon nitride.

In this manner, the first insulator 117 in each of the plurality of interlayer lenses IL, and the uppermost insulating film (interlayer insulating film 118) in the peripheral region PPR in the multilayer wiring structure ML are made of the same material. Both the first insulator 117 and interlayer insulating film 118 cover the interlayer insulating film 115. Thus, the first insulator 117 and interlayer insulating film 118 have structures suitable for formation in a single step. Moreover, the second insulator 122 and passivation film 121 serve as a continuous film and are made of the same material. Thus, the second insulator 122 and passivation film 121 have structures suitable for formation in a single step. Hence, according to this embodiment, it is possible to provide a photoelectric conversion device including a plurality of interlayer lenses and a multilayer wiring structure suitable for manufacture using few steps.

In this embodiment (see FIG. 2), the interlayer lenses IL cover the interlayer insulating film 115 between the uppermost wiring layer 116 and the wiring layer 114 below it in the pixel array region PAR. This facilitates shortening of the distance between the interlayer lenses IL and light-receiving surfaces 112a of the photoelectric converters 112. That is, according to this embodiment, it is possible to provide a photoelectric conversion device which can shorten the distance between interlayer lenses and photoelectric converters. This, in turn, makes it possible to easily suppress a decrease in focusing efficiency, which is the ratio of the amount of light received by the photoelectric converters 112 to that of light incident on the pixel array region PAR.

Also, in this embodiment (see FIG. 2), the first insulator 117 in each of the plurality of interlayer lenses IL, and the uppermost insulating film (interlayer insulating film 118) in the peripheral region PPR in the multilayer wiring structure ML can be made of, for example, silicon oxide. The parasitic capacitance between the wiring layers in the peripheral region PPR can be smaller and the circuit operation can be faster when the interlayer insulating film 118 is made of silicon oxide than when it is made of silicon nitride with a high dielectric constant.

A method of manufacturing a photoelectric conversion device according to the embodiment will be described next with reference to FIGS. 3A to 3D and 2. In a step shown in FIG. 3A, a semiconductor substrate SB is prepared. The semiconductor substrate SB is made of, for example, silicon. A well region 111 is formed by implanting a low-concentration impurity of a second conductivity type (for example, the p-type) into the semiconductor substrate SB. An element isolation portion (not shown) to electrically isolate a plurality of photoelectric converters 112 and a plurality of transistors 123, 124, and 125 from each other is formed on the semiconductor substrate SB to define an active region in the well region 111. A plurality of photoelectric converters 112 are formed on the semiconductor substrate SB in a pixel array region PAR by implanting an impurity of a first conductivity type (for example, the n-type) opposite to the second conductivity type using a predetermined resist pattern as a mask. A gate 123 of a transistor is formed on the semiconductor substrate SB. The gate 123 is made of, for example, polysilicon. Semiconductor regions 124 and 125 are formed on the semiconductor substrate SB in a peripheral region PPR by implanting an impurity of the first conductivity type using the gate 123 and the predetermined resist pattern as a mask. An insulating film is deposited by the CVD (Chemical Vapor Deposition) method to cover the semiconductor substrate SB and gate 123, and is planarized by the CMP (Chemical Mechanical Polishing) method. The insulating film is made of, for example, silicon oxide. Thus, an interlayer insulating film 113 is formed on the semiconductor substrate SB in the pixel array region PAR and peripheral region PPR. A metal layer is formed on the interlayer insulating film 113. The metal layer is made of, for example, a metal or intermetallic compound containing aluminum as a major component. The formed metal layer is patterned to form a wiring layer 114.

Figure 3A:
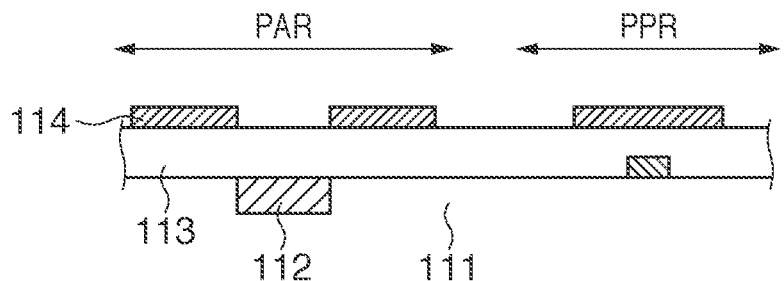
FIGS. 3A to 3D are sectional views showing a method of manufacturing a photoelectric conversion device according to the embodiment.
Figure 3B:
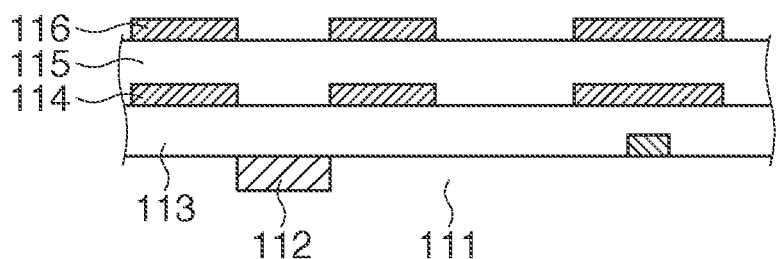

In a step shown in FIG. 3B, an insulating film is formed by the CVD method to cover the wiring layer 114 and interlayer insulating film 113, and planarized by the CMP method. The insulating film is made of, for example, silicon oxide. Thus, an interlayer insulating film 115 is formed above the semiconductor substrate SB in the pixel array region PAR and peripheral region PPR. A metal layer is formed on the interlayer insulating film 115. The metal layer is made of, for example, a metal or intermetallic compound containing aluminum as a major component. The formed metal layer is patterned to form a wiring layer 116.

Figure 3C:
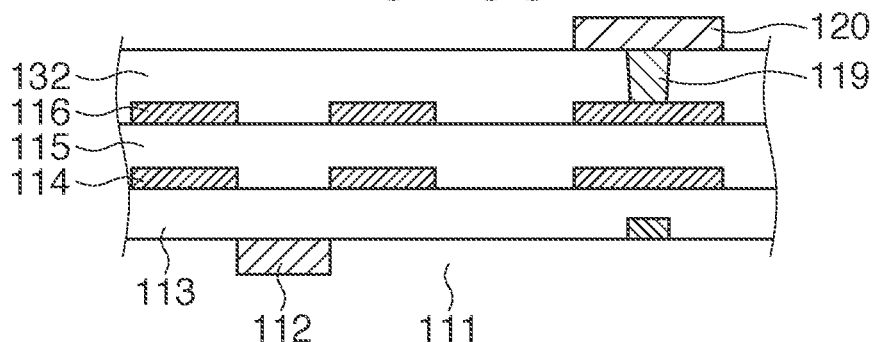

In a step (first step) shown in FIG. 3C, an insulator is deposited by the CVD method to cover the wiring layer 116 and interlayer insulating film 115, and planarized by the CMP method. The insulator is made of, for example, silicon oxide. Thus, an insulating layer 132 is formed above the semiconductor substrate SB in the pixel array region PAR and peripheral region PPR. The insulating layer 132 is a prospective insulator layer which is going to be a first insulator 117 in the pixel array region PAR and an interlayer insulating film 118 in the peripheral region PPR. In the peripheral region PPR, a via hole is formed in the insulating layer 132 and a conductor is buried in it to form a via plug 119. The conductor is made of, for example, a metal or intermetallic compound containing tungsten as a major component. A metal layer is formed on the insulating layer 132. The metal layer is made of, for example, a metal or intermetallic compound containing aluminum as a major component. The formed metal layer is patterned to form a wiring layer 120.

Figure 3D:
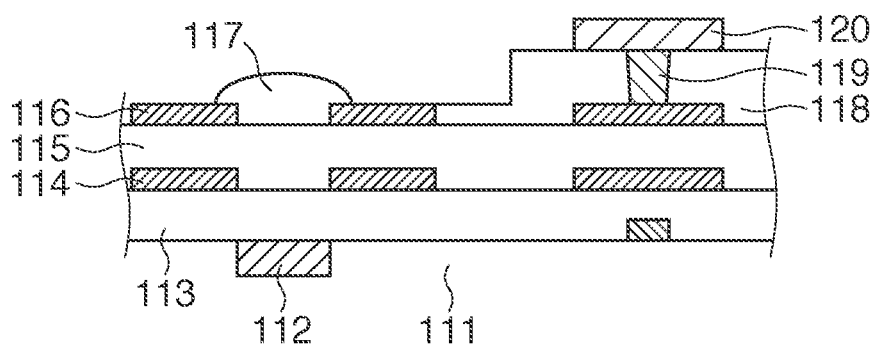

In a step (second step) shown in FIG. 3D, the insulating layer 132 in the pixel array region PAR is patterned using techniques such as lithography and dry etching to form a first insulator 117 and interlayer insulating film 118 with shapes convexed upward. More specifically, a photoresist pattern is formed to have an island pattern which covers the photoelectric converter 112 and a pattern which covers the peripheral region PPR as a whole when seen through from a direction perpendicular to a surface SBa of the semiconductor substrate SB in the pixel array region PAR. The formed photoresist pattern is annealed (reflowed) to shape the island pattern in the photoresist pattern into a roughly semispherical convex pattern. By etching the insulating layer 132 using the photoresist pattern as a mask, a first insulator 117 is formed to have a shape convexed in a direction away from the surface SBa of the semiconductor substrate SB in the pixel array region PAR, and an uppermost interlayer insulating film 118 is formed in the peripheral region PPR, in the multilayer wiring structure ML. That is, a first insulator 117 is formed to have, as an upper surface 117a, a curved surface projecting in a direction away from the surface SBa of the semiconductor substrate SB, following the roughly semispherical convex pattern in the photoresist pattern. In addition to this, an interlayer insulating film 118 is formed to cover the wiring layer 116 and interlayer insulating film 115 in the peripheral region PPR, following the pattern which covers the peripheral region PPR in the photoresist pattern as a whole. The interlayer insulating film 118 does not cover the wiring layer 116 and interlayer insulating film 115 in the pixel array region PAR.

The above-mentioned photoresist pattern may be superimposed on a photoresist pattern, which is formed to cover the entire surface across the pixel array region PAR and peripheral region PPR, and the insulating layer 132 may be etched using these photoresist patterns as a mask. In this case, the first insulator 117 and interlayer insulating film 118 can be formed as a continuous film. Also, the interlayer insulating film 118 may partially fall within the pixel array region PAR. Nevertheless, any steps of the interlayer insulating film 118 are eliminated from the pixel array region PAR by removing the interlayer insulating film 118 from the pixel array region PAR, and this facilitates maintenance of the evenness of the pixel array region PAR.

In a step (third step) shown in FIG. 2, an insulating film is formed to cover the first insulator 117, wiring layer 116, interlayer insulating film 118, and wiring layer 120. The insulating film is made of, for example, silicon nitride. That is, using a material with a refractive index higher than the first insulator 117, a second insulator 122 is formed to cover the first insulator 117, and a passivation film 121 is formed to cover the wiring layer 116 in the pixel array region PAR and the wiring layer 120 in the peripheral region PPR. A structure shown in FIG. 2 is formed by the foregoing steps. Although a lower planarizing film, a color filter layer, an upper planarizing film, and a plurality of microlenses, for example, are subsequently formed, a description thereof will not be given.

In this manner, the first insulator 117 is formed in each of the interlayer lenses IL, and the interlayer insulating film 118 is formed in the peripheral region PPR in the multilayer wiring structure ML, both in a single step. Also, the second insulator 122 and passivation film 121 are formed in each of the interlayer lenses IL in a single step. This makes it possible to manufacture a plurality of interlayer lenses and a multilayer wiring structure using few steps. In the steps shown in FIGS. 3A to 3D, a method of removing the insulating layer 132 in the pixel array region PAR without forming the insulating layer 132 in a convex shape, and forming the insulating film in a convex shape, for example, is also possible. Nevertheless, this method requires one more step of forming the insulating film in a convex shape, in addition to the manufacturing method according to this embodiment. Hence, according to this embodiment, it is possible to provide a photoelectric conversion device which can suppress a decrease in amount of incident light, and a method of manufacturing the same because few steps are used, the parasitic capacitance between the wiring layers is kept small, and the total thickness of the interlayer insulating films is kept small.

Each of the plurality of interlayer lenses IL in the photoelectric conversion device may further include an antireflection film (not shown), between the first insulator 117 and the second insulator 122, which prevents light incident on the interface between the first insulator 117 and the second insulator 122 from being reflected by the interface. The antireflection film is made of a material with a refractive index between those of the first insulator 117 and second insulator 122. The antireflection film can be made of silicon oxynitride if, for example, the first insulator 117 is made of silicon oxide, and the second insulator 122 is made of silicon nitride. An antireflection film may further be sandwiched between the interlayer insulating film 113 and the semiconductor substrate SB to prevent light incident on the interface between the interlayer insulating film 113 and the semiconductor substrate SB from being reflected by the interface. The antireflection film is made of a material with a refractive index between those of the interlayer insulating film 113 and semiconductor substrate SB. The antireflection film can be made of silicon oxynitride if, for example, the interlayer insulating film 113 is made of silicon oxide, and the semiconductor substrate SB is made of silicon.

Figure 4:
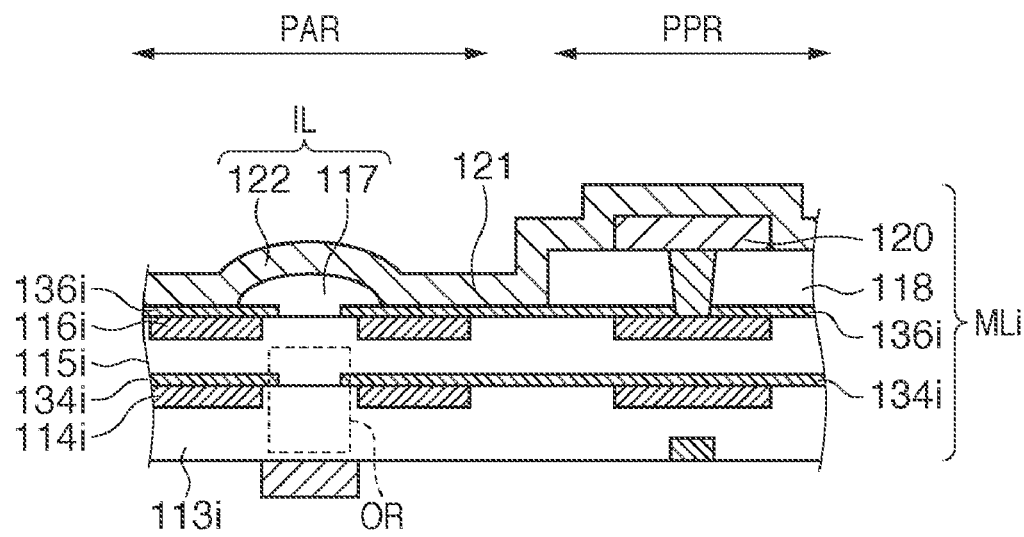
FIG. 4 is a sectional view showing the cross-sectional structure of a photoelectric conversion device according to a modification to the embodiment.

Also, as shown in FIG. 4, a wiring layer 114$i$ and wiring layer 116$i$ may have damascene structures in a multilayer wiring structure MLi of a photoelectric conversion device 800$i$. That is, the wiring layer 114$i$ may be formed by burying a conductor in a trench formed in an interlayer insulating film 113$i$. The conductor is made of, for example, a metal or intermetallic compound containing copper as a major component. Alternatively, the conductor may have a structure containing not only the above-mentioned metal or intermetallic compound but also a barrier metal, which are stacked on each other. In this case, to prevent the material of the wiring layer 114$i$ from diffusing into an interlayer insulating film 115$i$, a diffusion preventive film 134$i$ is formed to cover the wiring layer 114$i$. The diffusion preventive film 134$i$ has an opening formed in a portion corresponding to the opening region OR. Also, the wiring layer 116$i$ may be formed by burying a conductor in a trench formed in the interlayer insulating film 115$i$. The conductor can be made of, for example, the same material as the wiring layer 114$i$. In this case, to prevent the material of the wiring layer 116$i$ from diffusing into the interlayer insulating film 118, a diffusion preventive film 136$i$ is formed to cover the wiring layer 116$i$. The diffusion preventive film 136$i$ has an opening corresponding to the opening region OR. On the other hand, in the multilayer wiring structure MLi, the uppermost wiring layer 120 in the peripheral region PPR must have the same structure as in the above-mentioned embodiment, that is, a wiring structure patterned by etching. This is because the wiring layer 120 includes a bonding pad to electrically connect it to external equipments, so a wiring material with the same structure as in the above-mentioned embodiment can more easily form connection (coupling) to the bonding pad than that with a damascene structure.

A method of manufacturing the interlayer lenses IL in the structure shown in FIG. 4 can be the same as that in the structure shown in FIG. 2. Alternatively, the via plug and the wiring layer 120 may be formed after the first insulator 117 and interlayer insulating film 118 are formed. In this case, the diffusion preventive film 136$i$ can function as an etching stop film when unnecessary portions of the conductors of the via plug and wiring layer 120 are removed.

Figure 5:
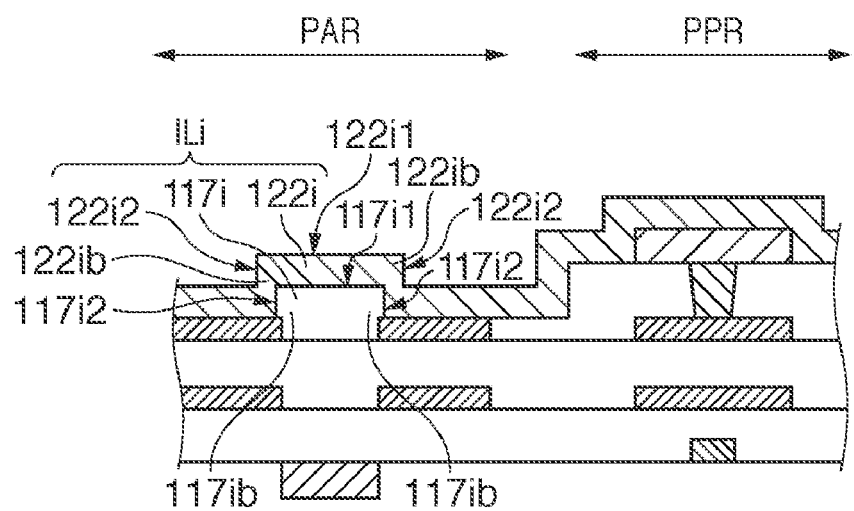
FIG. 5 is a sectional view showing the cross-sectional structure of a photoelectric conversion device according to another modification to the embodiment.

Moreover, as shown in FIG. 5, a first insulator 117$i$ may have a rectangular cross-section in a direction perpendicular to the surface SBa of the semiconductor substrate SB in each interlayer lens ILi of a photoelectric conversion device 800$j$. Note that the "rectangular shape" includes not only the shape of a rectangle but also a shape with round corners while maintaining the basic shape of a rectangle. In this case, the first insulator 117$i$ may have an upper surface 117$i$1 and side surface 117$i$2. The upper surface 117$i$1 extends parallel to the surface SBa of the semiconductor substrate SB. The side surface 117$i$2 extends to come close to the surface SBa of the semiconductor substrate SB from the edge of the upper surface 117$i$1. In this case, a second insulator 122$i$ has an upper surface 122$i$1 and side surface 122$i$2 as the first insulator 117$i$ has the upper surface 117$i$1 and side surface 117$i$2. The upper surface 122$i$1 extends parallel to the surface SBa of the semiconductor substrate SB. The side surface 122$i$2 extends to come close to the surface SBa of the semiconductor substrate SB from the edge of the upper surface 117$i$1. In this case as well, the second insulator 122$i$ with a refractive index higher than the first insulator 117$i$ covers the first insulator 117$i$ in each interlayer lens IL. Light which enters an edge 122$ib$ of the second insulator 122$i$ at a large incident angle with respect to a normal to the surface SBa of the semiconductor substrate SB is refracted toward the photoelectric converter 112 by the interface, and passes through an edge 117$ib$ of the first insulator 117$i$. That is, light which passes through the vicinity of the edge 122$ib$ of the second insulator 122$i$ is bent toward the photoelectric converter 112 as if it were sucked into it. Thus, the first insulator 117$i$ and second insulator 122$i$ function as the interlayer lens ILi. The first insulator 117$i$ and second insulator 122$i$ in the interlayer lens ILi can be obtained by omitting annealing (reflowing) in the step shown in FIG. 3D. That is, because an annealing step in which a photoresist mask is formed for etching is unnecessary, the number of steps can be smaller than in the above-mentioned embodiment.

Figure 6:
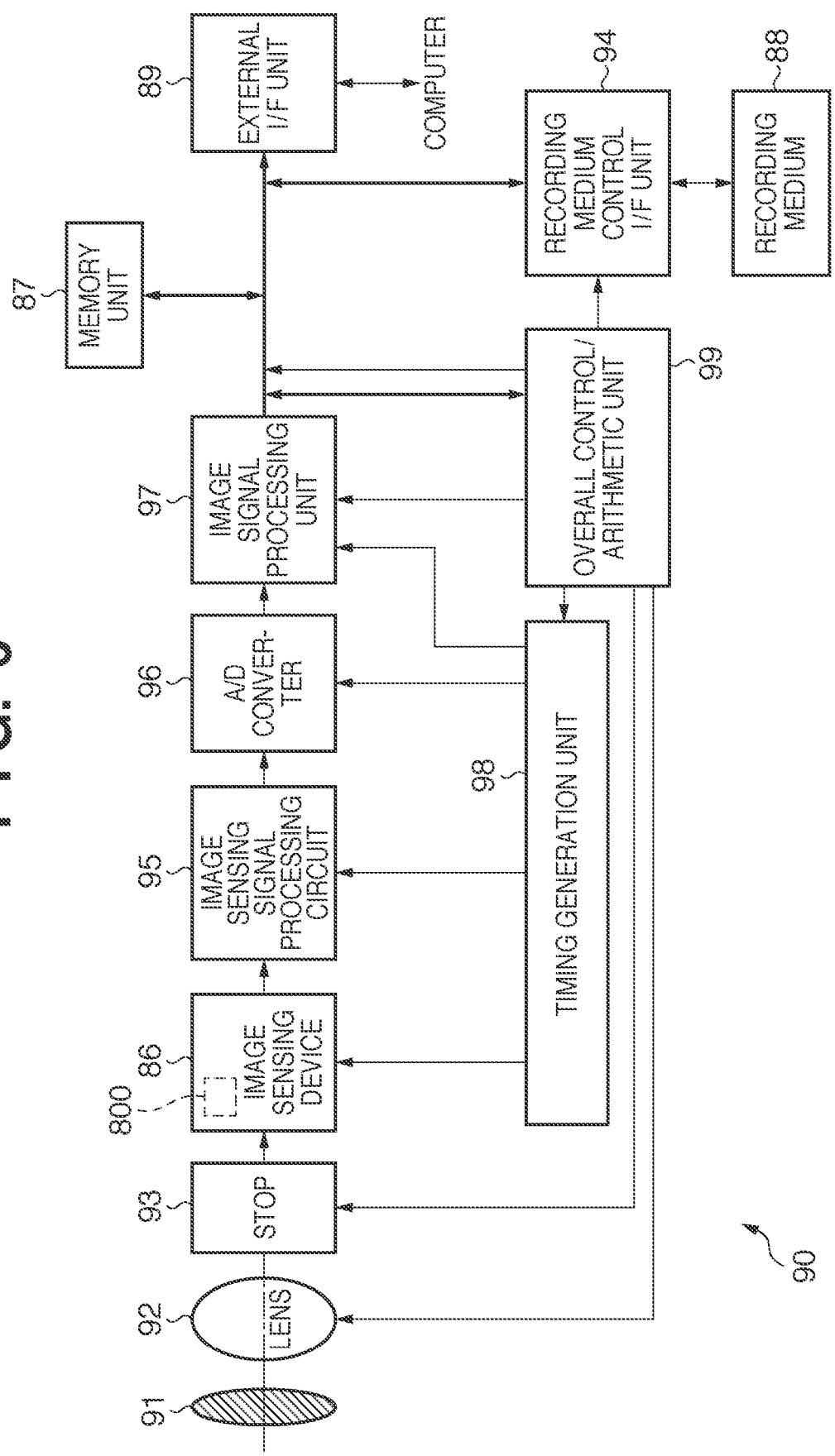
FIG. 6 is a block diagram showing the configuration of an image sensing system to which the photoelectric conversion device according to the embodiment is applied.

FIG. 6 illustrates an example of an image sensing system to which a photoelectric conversion device according to the present invention is applied. An image sensing system 90 mainly includes an optical system, an image sensing device 86, and a signal processing unit, as shown in FIG. 6. The optical system mainly includes a shutter 91, lens 92, and stop 93. The image sensing device 86 includes a photoelectric conversion device 800. The signal processing unit mainly includes an image sensing signal processing circuit 95, A/D converter 96, image signal processing unit 97, memory unit 87, external I/F unit 89, timing generation unit 98, overall control/arithmetic unit 99, recording medium 88, and recording medium control I/F unit 94. The signal processing unit may include no recording medium 88.

The shutter 91 is inserted in the optical path in front of the lens 92, and controls exposure. The lens 92 refracts the incident light to form an object image on the image sensing surface of the photoelectric conversion device 800 of the image sensing device 86. The stop 93 is inserted in the optical path between the lens 92 and the photoelectric conversion device 800, and adjusts the amount of light guided to the photoelectric conversion device 800 after passing through the lens 92.

The photoelectric conversion device 800 of the image sensing device 86 converts the object image formed on the image sensing surface of the photoelectric conversion device 800 into an image signal. The image sensing device 86 reads out the image signal from the photoelectric conversion device 800, and outputs it.

The image sensing signal processing circuit 95 is connected to the image sensing device 86, and processes the image signal output from the image sensing device 86. The A/D converter 96 is connected to the image sensing signal processing circuit 95, and converts the processed image signal (analog signal) output from the image sensing signal processing circuit 95 into another image signal (digital signal).

The image signal processing unit 97 is connected to the A/D converter 96, and performs various kinds of arithmetic processing such as correction for the image signal (digital signal), output from the A/D converter 96, to generate image data. The image data is provided to, for example, the memory unit 87, external I/F unit 89, overall control/arithmetic unit 99, and recording medium control I/F unit 94.

The memory unit 87 is connected to the image signal processing unit 97, and stores the image data output from the image signal processing unit 97.

The external I/F unit 89 is connected to the image signal processing unit 97. In this way, the image data output from the image signal processing unit 97 is transferred to external devices (for example, a personal computer) via the external I/F unit 89.

The timing generation unit 98 is connected to the image sensing device 86, image sensing signal processing circuit 95, A/D converter 96, and image signal processing unit 97. In this way, timing signals are provided to the image sensing device 86, image sensing signal processing circuit 95, A/D converter 96, and image signal processing unit 97. The image sensing device 86, image sensing signal processing circuit 95, A/D converter 96, and image signal processing unit 97 then operate in synchronism with the timing signals.

The overall control/arithmetic unit 99 is connected to the timing generation unit 98, image signal processing unit 97, and recording medium control I/F unit 94, and systematically controls them.

The recording medium 88 is detachably connected to the recording medium control I/F unit 94. In this way, the image data output from the image signal processing unit 97 is recorded on the recording medium 88 via the recording medium control I/F unit 94.

With the foregoing arrangement, a high-quality image (image data) can be obtained when the photoelectric conversion device 800 obtains a high-quality image signal.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-199017, filed Aug. 28, 2009, which is hereby incorporated by reference herein in its entirety.

What is claimed is:

1. A photoelectric conversion device having a pixel array region in which a plurality of pixels each including a photoelectric converter are arrayed, and a peripheral region arranged around the pixel array region, the device comprising:
   a multilayer wiring structure which is arranged on a semiconductor substrate, and includes wiring layers, a number of the wiring layers in the peripheral region being more than a number of the wiring layers in the pixel array region; and
   a plurality of interlayer lenses arranged on the multilayer wiring structure in the pixel array region,
   wherein each of the plurality of interlayer lenses includes a first insulator and a second insulator arranged to cover the first insulator, the second insulator having a refractive index higher than a refractive index of the first insulator, and
   wherein a material of the first insulator in each of the plurality of interlayer lenses is the same as a material of an uppermost interlayer insulating film in the peripheral region, which is arranged between the wiring layers in the multilayer wiring structure.

2. The device according to claim 1, wherein the first insulator in each of the plurality of interlayer lenses, and the uppermost interlayer insulating film in the peripheral region in the multilayer wiring structure are made of silicon oxide.

3. The device according to claim 1, wherein the first insulator covers a portion, positioned above the photoelectric converter, of an uppermost interlayer insulating film in the pixel array region in the multilayer wiring structure.

4. The device according to claim 1, wherein the first insulator has, as an upper surface, a curved surface projecting in a direction away from a surface of the semiconductor substrate.

5. The device according to claim 1, wherein the first insulator has a rectangular cross-section in a direction perpendicular to a surface of the semiconductor substrate.

6. The device according to claim 1, further comprising
   a passivation film configured to cover an uppermost wiring layer in the pixel array region and an uppermost wiring layer in the peripheral region,
   wherein the second insulator and the passivation film are made of an identical material.

7. The device according to claim 6, wherein the second insulator and the passivation film are made of silicon nitride.

8. The device according to claim 1, wherein each of the plurality of interlayer lenses further includes an antireflection film configured to prevent light incident on an interface between the first insulator and the second insulator from being reflected by the interface.

9. An image sensing system comprising:
   a photoelectric conversion device defined in claim 1;
   an optical system configured to form an image on an image sensing surface of the photoelectric conversion device; and
   a signal processing unit configured to process a signal, output from the photoelectric conversion device, to generate image data.

10. The device according to claim 1, wherein each of the interlayer lenses is arranged at a position that is nearer to a surface of the semiconductor substrate than a position at which the uppermost interlayer insulating film in the peripheral region is arranged.

11. A method of manufacturing a photoelectric conversion device having a pixel array region in which a plurality of pixels each including a photoelectric converter are arrayed, and a peripheral region arranged around the pixel array region, the method comprising:

forming an insulating layer in the pixel array region and the peripheral region at a position above a semiconductor substrate;

forming a wiring layer on the insulating layer in the peripheral region;

patterning the insulating layer to form a first insulator in the pixel array region, and an uppermost interlayer insulating film in the peripheral region in a multilayer wiring structure; and forming a second insulator using a material with a refractive index higher than a refractive index of the first insulator to cover the first insulator, wherein the first insulator and the second insulator form an interlayer lens configured to focus light on one of the photoelectric converters.

\* \* \* \* \*